(12) United States Patent
Liang et al.

(10) Patent No.: US 6,743,664 B2
(45) Date of Patent: Jun. 1, 2004

(54) FLIP-CHIP ON FLEX FOR HIGH PERFORMANCE PACKAGING APPLICATIONS

(75) Inventors: Chunlin Liang, San Jose, CA (US); Larry Eugene Mosley, Sunnyvale, CA (US); Chun Mu, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/015,819

(22) Filed: Dec. 6, 2001

(65) Prior Publication Data

US 2002/0081774 A1 Jun. 27, 2002

Related U.S. Application Data

(62) Division of application No. 09/538,327, filed on Mar. 29, 2000, now Pat. No. 6,365,962.

(51) Int. Cl.[7] .............................................. H01L 21/28
(52) U.S. Cl. ........................ 438/124; 438/114; 438/126
(58) Field of Search ................................ 438/111, 112, 438/113, 114, 115–118, 120, 121, 122, 123, 124, 125, 126, 131, 132, 133, 140, 106; 257/679, 668

(56) References Cited

U.S. PATENT DOCUMENTS

| | | | | |
|---|---|---|---|---|
| 5,642,262 A | * | 6/1997 | Terrill et al. | 361/783 |
| 5,661,336 A | * | 8/1997 | Phelps et al. | 257/668 |
| 5,696,032 A | * | 12/1997 | Phelps et al. | 438/111 |
| 5,889,320 A | * | 3/1999 | Phelps et al. | 257/698 |
| 5,998,859 A | * | 12/1999 | Griswold et al. | 257/679 |
| 6,043,557 A | * | 3/2000 | Phelps et al. | 257/668 |
| 6,365,962 B1 | * | 4/2002 | Liang et al. | 257/668 |

* cited by examiner

*Primary Examiner*—Jack Chen
*Assistant Examiner*—Laura M Schillinger
(74) *Attorney, Agent, or Firm*—Blakely, Sokoloff, Taylor & Zafman LLP

(57) ABSTRACT

A method is provided including attaching an encapsulant to an integrated circuit (IC), forming a substrate from at least one layer of dielectric, attaching at least one electrical contact to the substrate, attaching a first surface of the substrate to the encapsulant so that the substrate is connected to the IC, attaching an electrical element to a second surface of the substrate, and electronically connecting the first surface of the substrate and the second surface of the substrate.

13 Claims, 8 Drawing Sheets

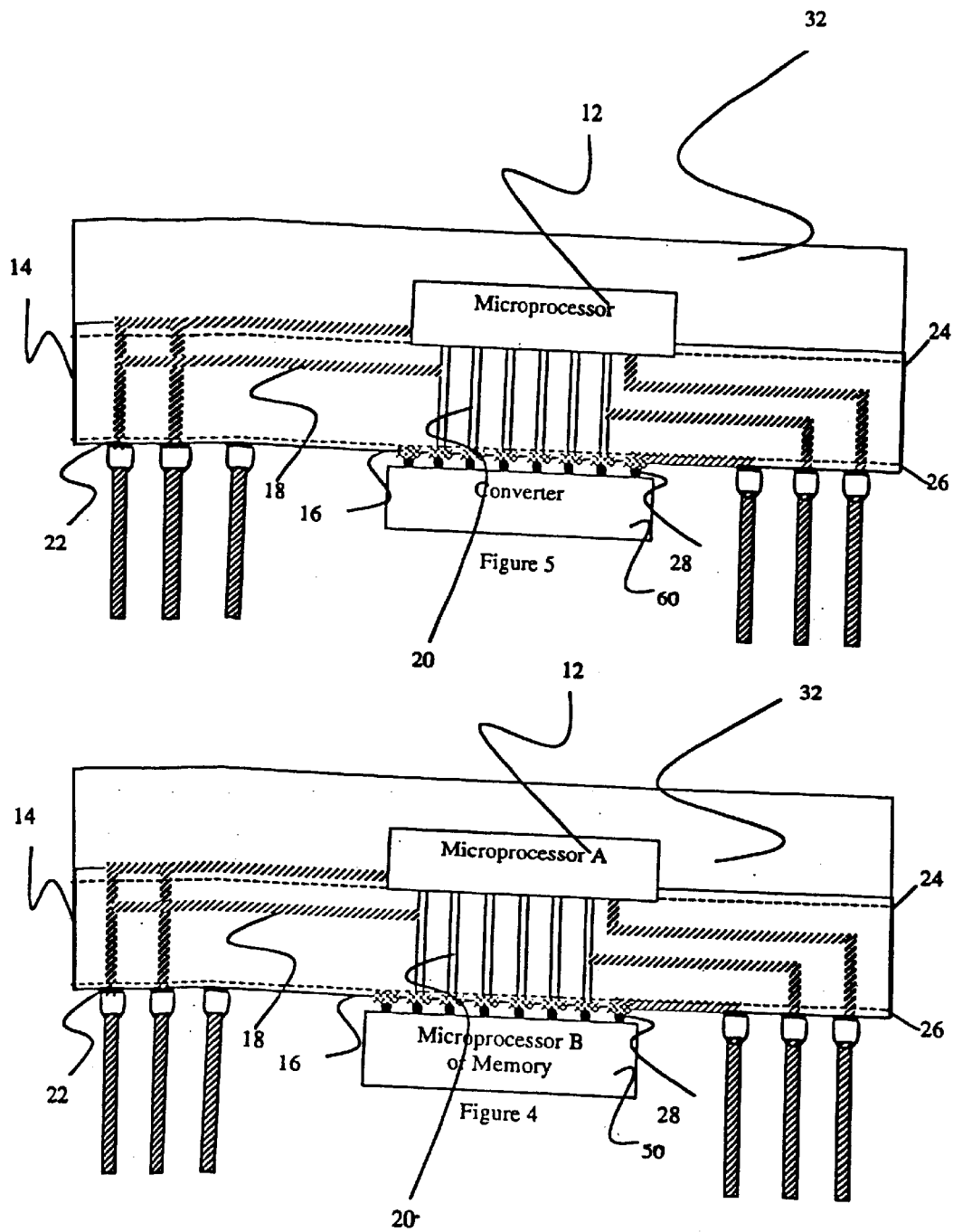

FLIP-CHIP ON FLEX FOR HIGH PERFORMANCE PACKAGING APPLICATIONS

This application is a division of U.S. patent application Ser. No. 09/538,327, filed Mar. 29, 2000 U.S. Pat. No. 6,365,962.

BACKGROUND OF THE INVENTION

1. Field of the Invention

The present invention relates to an integrated circuit package that contains a flexible circuit board.

2. Background Information

Integrated circuits (IC's) are typically assembled into a package that is mounted to a printed circuit board. The printed circuit board may be the motherboard of a computer. The integrated circuit may be mounted to a substrate and encapsulated with a plastic or epoxy material. A process known to those skilled in the art as flip-chip technology may be used to attach an IC to a substrate with the IC's I/O (input/output) side facing the substrate. One method that may be used to attach the flip-chip to the substrate is known as C4 attachment (controlled-collapse chip connection). With C4, solder bumps are placed on metal terminals on the flip-chip and a matching area of solder terminals on the substrate. The flip-chip is then aligned to the substrate, and all solder connections are made simultaneously by reflowing the solder. The substrate is typically a printed circuit board that has a number of pins, known as pin grid array (PGA), or solder balls, known as a ball grid array (BGA), that can be connected to the motherboard.

The substrate contains a number of routing traces, vias and solder pads that electrically connect the integrated circuit to the motherboard. The routing traces and solder pads may be separated by one or more layers of dielectric material.

The substrate/printed circuit board is fabricated before the integrated circuit is mounted to the substrate The substrate must be thick enough to provide enough structural integrity to support the integrated circuit during the mounting process.

For CMOS (complementary metal oxide semiconductor) logic application, the IC chip integrated into a single package is typically accomplished through a multi-chip module using a 2-dimensional array. This type of package, however, suffers from longer inter-chip connection length. Some of the problems arising from such a package are: high propagation delay, high inductance, and cross-talking noise. In a case where a 3-dimensional array integration package is used, chips are stacked on top of each other and the inter-chip interconnection is achieved through edge wire bonding. A problem with this type of package is that the total I/O is limited.

In an array interconnect package, alignment and attachment are typically difficult to accomplish. For de-coupling needs, discrete de-coupling capacitors are typically mounted on the die-side or landside of the package after die attachment. For die-side capacitors, a larger package is typically required which increases cost. For landside capacitors, a typical package has a large die-to-capacitor separation and a large current loop, which leads to large inductance and degraded system performance.

BRIEF DESCRIPTION OF THE DRAWINGS

FIG. 4 An embodiment of the present invention with a microprocessor A and either a Microprocessor B or a memory with a pin grid array (PGA).

FIG. 5 An embodiment of the present invention with a microprocessor and a converter with a pin grid array (PGA).

DETAILED DESCRIPTION

Referring to the figures, exemplary embodiments of the invention will now be described. The exemplary embodiments are provided to illustrate the invention and should not be construed as limiting the scope of the invention.

Figure 1:
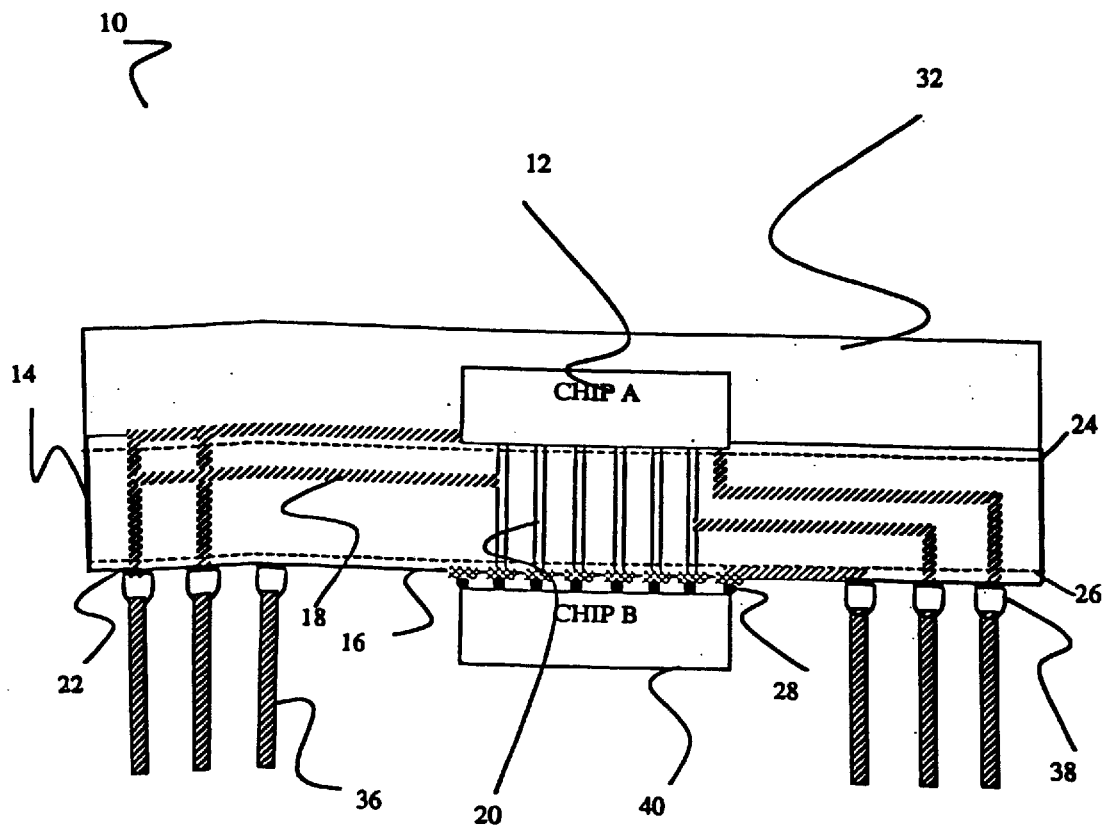
FIG. 1 An embodiment of the present invention with two integrated circuits and a pin grid array (PGA).

FIG. 1 shows an embodiment of an integrated circuit (IC) package 10 of the present invention. The package 10 may include an IC 12 that is mounted to a substrate 14. The substrate 14 may include a plurality of solder pads 16, routing traces 18, vias 20 and land pads 22 that connect a top substrate surface 24 with a bottom substrate surface 26. The top surface 24 is separated from a bottom surface 26 by one or more layers of dielectric. The dielectric may be a flexible (FLEX) material such as a polyimide. A polyimide is commonly used to construct flexible circuit boards. Although a flexible polyimide material is described, it is to be understood that other types of material may be employed including a more rigid material. Embedding the IC 12 in the FLEX and connecting it through micro-via technology can reduce the connection pitch and allow more input/output (I/O).

The integrated circuit 12 may be mounted to solder pads (not shown) of the substrate 14 with solder bumps (not shown) in a process commonly referred to as controlled collapsed chip connection (C4). The solder bumps may be structurally reinforced with an underfill epoxy material (not shown). The integrated circuit 12 may be encapsulated with an encapsulant 32. The encapsulant 32 may be a plastic or epoxy material. The encapsulant 32 may also be attached to the substrate 14 in a manner that seals the integrated circuit 12.

Figure 2:
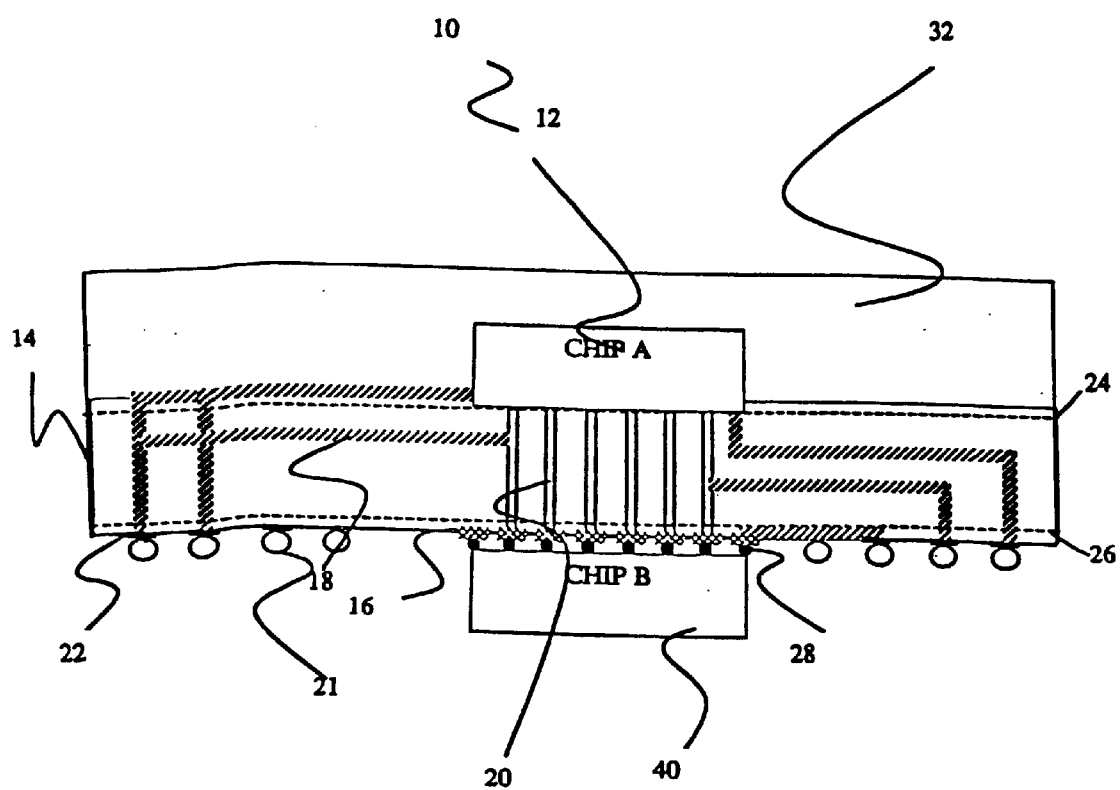
FIG. 2 An embodiment of the present invention with two integrated circuits and a solder ball grid array (BGA).

The package 10 may include a plurality of electrical contacts that are attached to corresponding land pads of the substrate 14. Each contact may include a pin 36 that is attached to a corresponding land pad 22 with a solder ball 38. The pins 36 can be soldered to solder pads or plated through holes of a printed circuit board (not shown), such as the motherboard of a computer. As an embodiment in FIG. 2 illustrates, the contacts may be solder balls 21 that are reflowed onto the motherboard using known ball grid array (BGA) processes.

Figure 3:
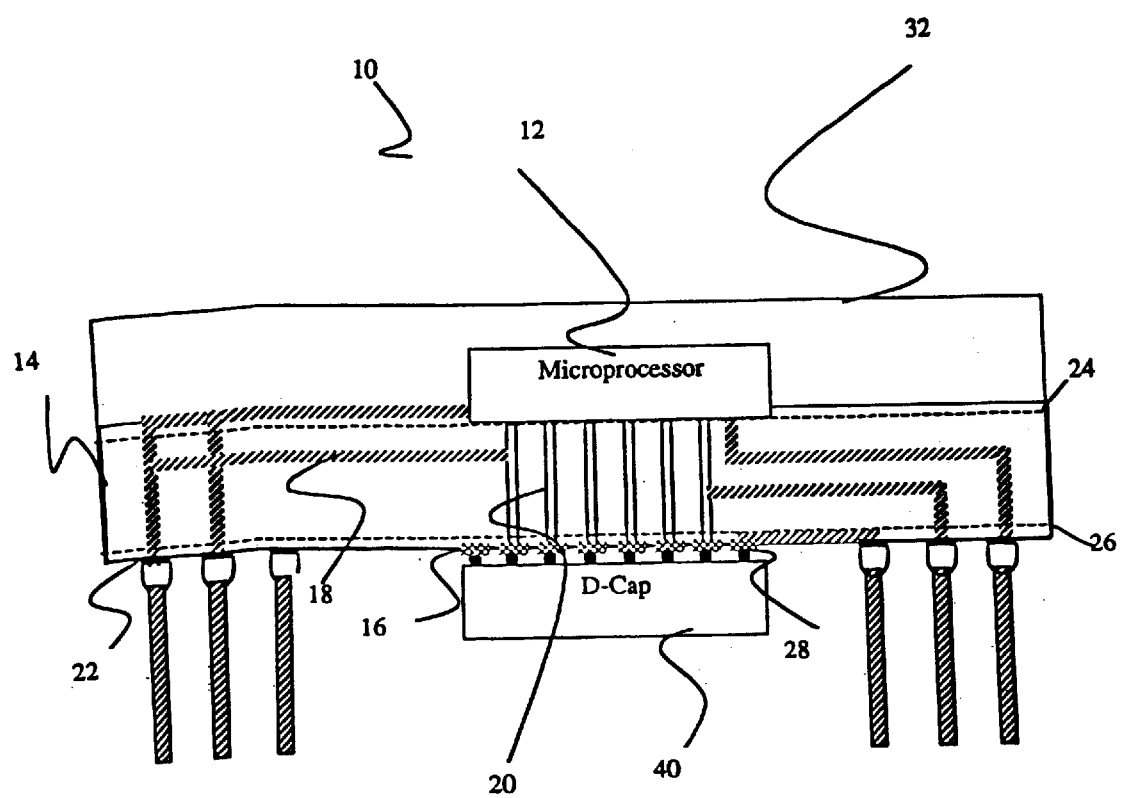
FIG. 3 An embodiment of the present invention with a microprocessor and a decoupling capacitor with a pin grid array (PGA).

The package 10 may also include an electrical element 40 mounted to the second surface 26 of the substrate 14. The element 40 may be mounted to the substrate 14 using C4 flip-chip processes and under-fill protection (not shown). The element 40 may be a passive or active device. By way of example, as illustrated in FIG. 3, the integrated circuit 12 may be a microprocessor and the electrical element 40 may be a de-coupling capacitor. Alternatively, an electrical element 50 may be a memory device or another microprocessor (B) that is directly connected to the microprocessor 12 (A), as illustrated in FIG. 4. The direct attachment of both the microprocessor 12 and the memory device 50 to the substrate provides an assembly with a relatively short electrical path between the devices. The short path length reduces the inductance, which can be important for high-speed memory busses between the processor and memory. Alternatively, an electrical element 60 may be a power delivery circuit(s) that includes power management, regulator/converter, etc., as illustrated in FIG. 5.

Figure 6:
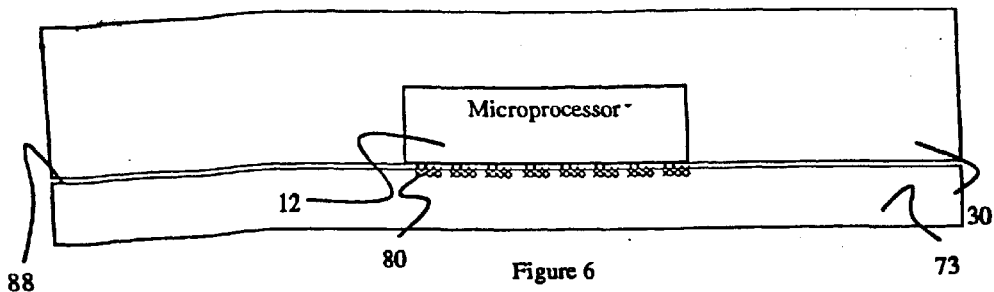
FIGS. 6–10 A process for forming an embodiment of the present invention.
Figure 7:
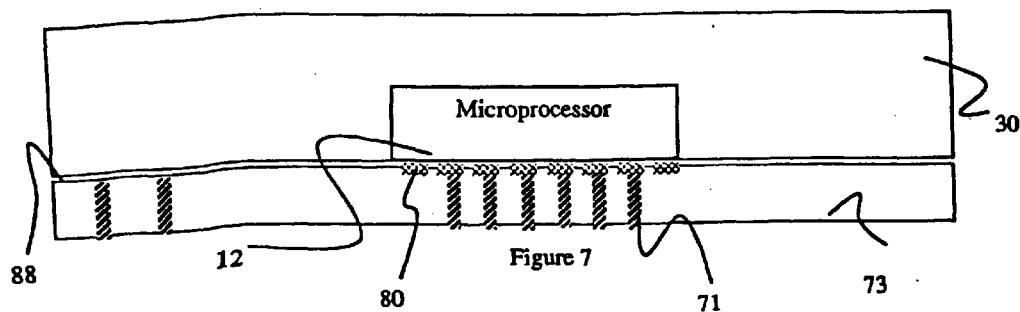

FIGS. 6–9 show a method for attaching the substrate 14 to the integrated circuit 12. As shown in FIG. 6, the encapsulant 30 can be initially molded onto the integrated circuit 12 in a manner that exposes the I/O pads of the circuit, and dielectric layer 73 is then attached to encapsulant 30 with an adhesive 88. As illustrated in FIG. 7, one or more via holes 71 can be formed in the first layer of dielectric 73 through to the I/O pads. The dielectric 73 may be a polyimide material, although it is to be understood that other materials may be integrated into the substrate 14. The via holes can be formed by laser drilling, mechanical drilling, etching or other techniques known in the art. The via holes 71 are then introduced with a conductive material. For example, electroplating or other methods may be used.

Figure 8:
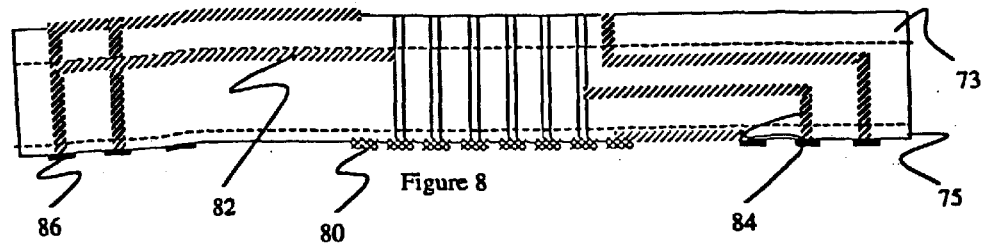
Figure 9:
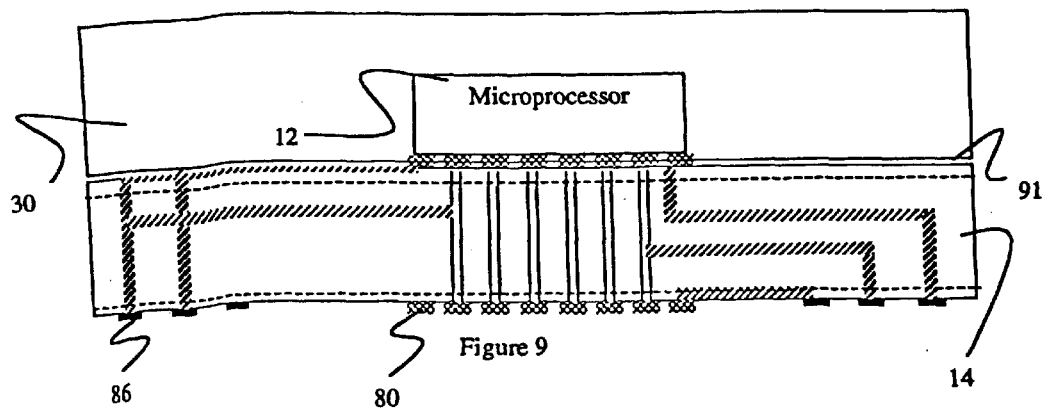
Figure 10:
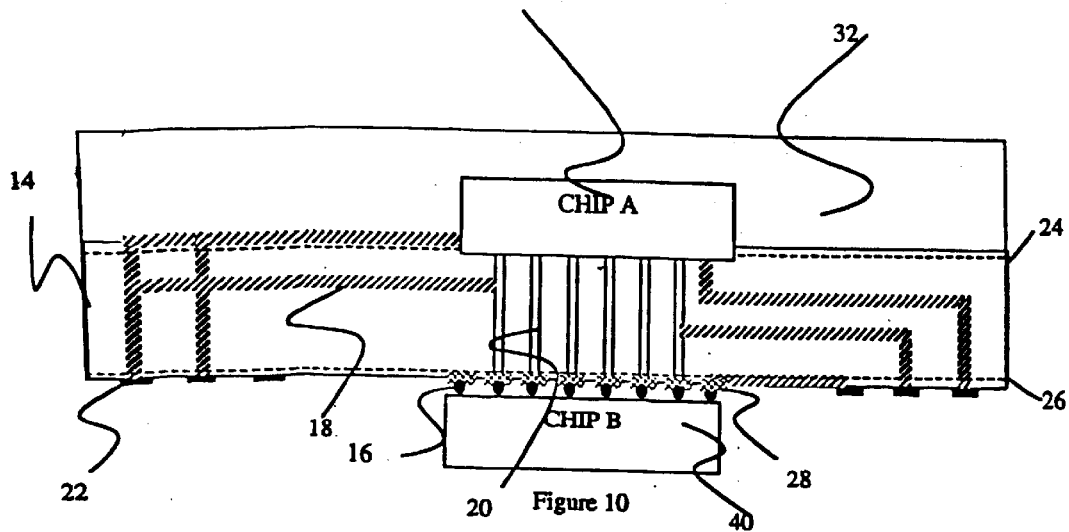
Figure 11:
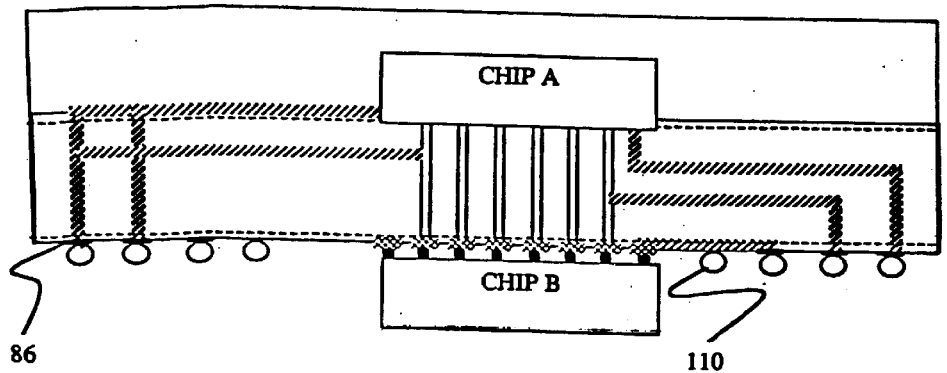
FIG. 11 Attachment of a BGA to an embodiment of the present invention.
Figure 12:
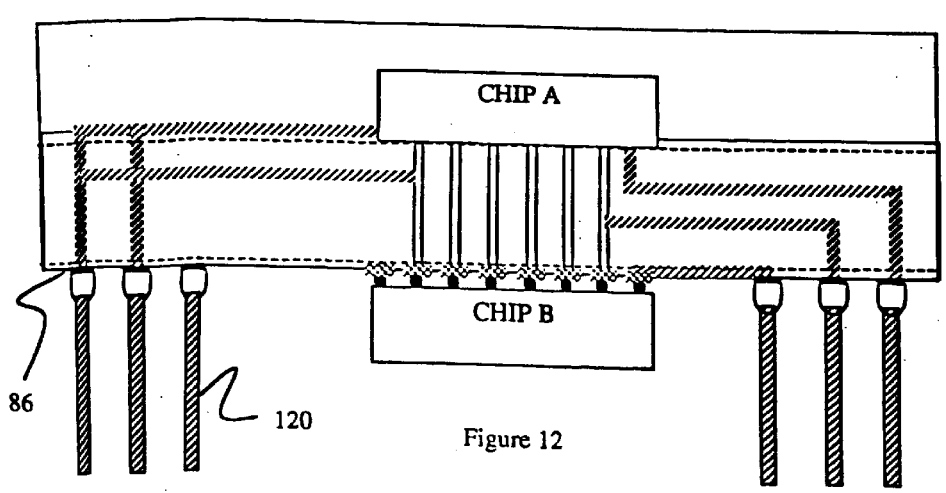
FIG. 12 Attachment of a PGA to an embodiment of the present invention.

As illustrated in FIG. 8, another layer of dielectric 75 may be added to the first layer of dielectric 73. Metal may be plated onto the dielectric layers 73 and 75 and etched to form the solder pads 80, routing traces 82, vias 84 and land pads 86 with known photolithography techniques. As illustrated in FIG. 9, the dielectric layers can then be attached to the integrated circuit 12 and substrate 14 with a layer of adhesive 91. The adhesive 91 may have holes that expose the I/O pads of the integrated circuit 12. A conductive epoxy can be inserted into the via holes to connect the I/O pads with the vias. FIG. 10 illustrates the addition of an electrical element 40. The electrical element 40 may be mounted to the substrate 14 using flip-chip C4 processes. Solder balls 110 and pins 120 can be subsequently attached to the land pads 86 to complete the package 10, as illustrated in FIGS. 11 and 12.

In the process shown in FIGS. 6–9 the encapsulant 30 and integrated circuit 12 provide a mechanical support for the dielectric while the substrate 14 is being fabricated and attached to the circuit 12. This support allows for a thinner layer of dielectric. By way of example, a dielectric layer no greater than approximately 35 microns can be used to fabricate the substrate 14, which may be on the order of approximately 100 microns combined. Prior art substrates typically have layers of dielectric no thinner than 0.001 meters. The thinner dielectric layer shortens the lengths of the vias and reduces the inductance of the substrate 14.

Figure 13B:
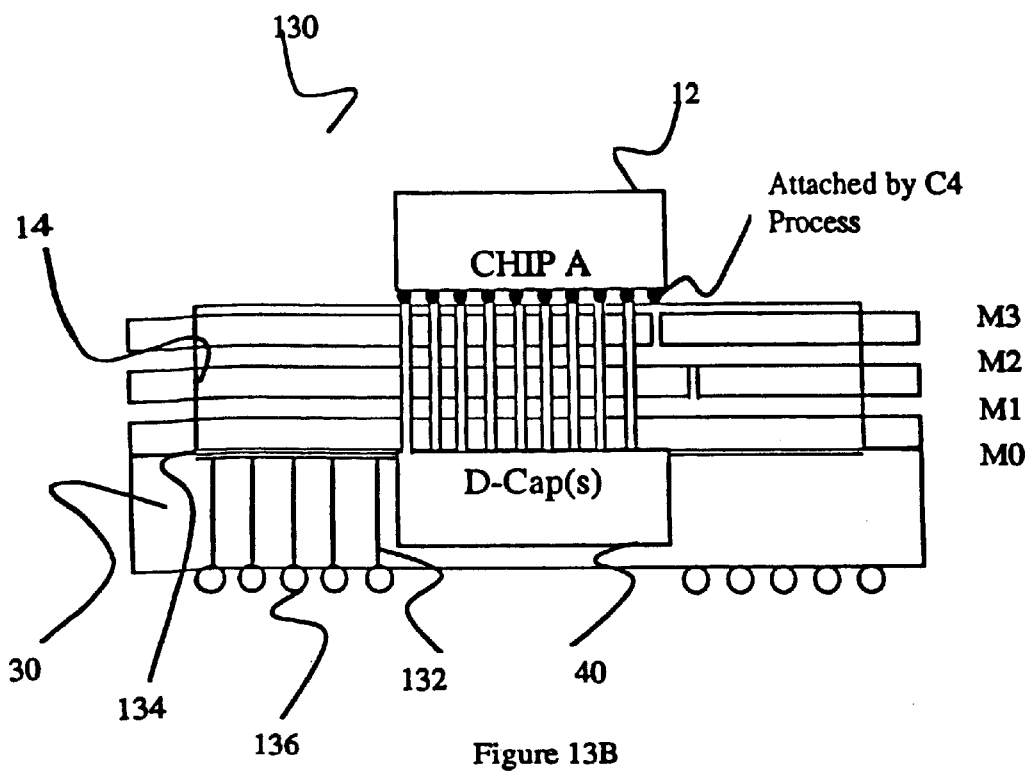
FIG. 13B An embodiment of the present invention with an integrated circuit connected on the die side a decoupling capacitor encapsulated.
Figure 13A:
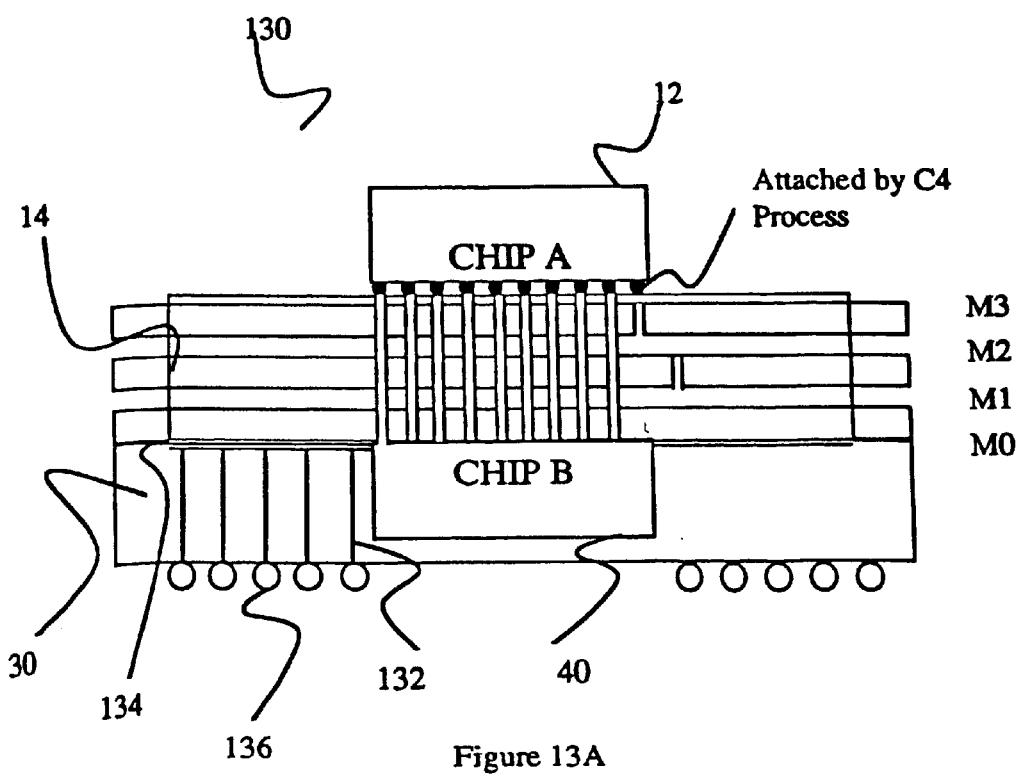
FIG. 13A An embodiment of the present invention with an integrated circuit connected on the die side and an integrated circuit encapsulated on the landside.

FIG. 13A shows an alternate embodiment 130 of a package 10 wherein the electrical element 40 is embedded into the encapsulant 30. As illustrated in FIG. 13B, the electrical element 40 may be decoupling capacitor(s). Embedding a decoupling capacitor(s) in the FLEX can save the cost from FLEX yield loss and avoid having the capacitors attached to the surface of the package interfering with the assembly process. The substrate 14 can be attached to the element 40 and encapsulant 30. The substrate 14 may be constructed with the fabrication process shown in FIGS. 6–9. The substrate 14 may consist of a plurality of dielectric layers M0, M1, M2 and M3. The encapsulant 30 may have a plurality of vias 132 and corresponding land pads 134 connected to the substrate 14. The vias 132 may be formed by drilling via holes, plating the holes with metal and then applying a conductive epoxy.

Solder balls 136 may be attached to the land pads 134. The solder balls 136 may be reflowed to attach the package 130 to a motherboard. An integrated circuit 12 may be mounted to the substrate 14. The circuit 12 may be attached to the substrate with a flip-chip C4 process. The integrated circuit 12 may be enclosed by a lid (not shown) or other means.

Figure 14:
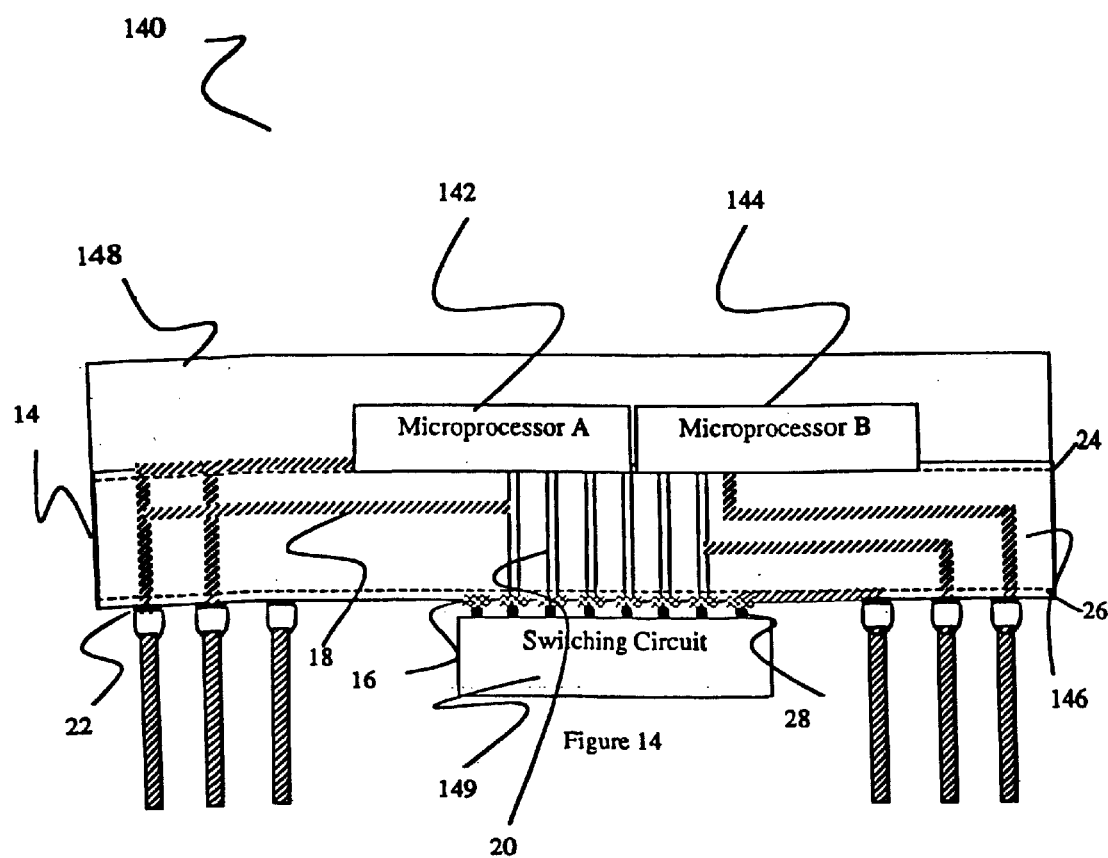
FIG. 14 An embodiment of the present invention with two microprocessors encapsulated and a switching circuit with a PGA.

FIG. 14 shows another embodiment 140 of a package 10 that has a first integrated circuit 142 and a second integrated circuit 144. The integrated circuits 142 and 144 are attached to a substrate 146 and enclosed by an encapsulant 148. The package 140 may have a plurality of contacts that can be attached to a motherboard.

The package 140 may also have a third integrated circuit 149 that is attached to the substrate 146. The first 142 and second 144 integrated circuits may be microprocessors. The third integrated circuit 149 may be a switching circuit that provides a re-configurable high performance interconnect system.

The exemplary embodiments, shown can provide fast, high current, low noise interconnect function between the ICs integrated inside a single package.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method comprising:

attaching an encapsulant to an integrated circuit (IC), wherein I/O pads of said integrated circuit retrain exposed;

forming a substrate from first layer of dielectric attached to said encapsulant;

attaching a second layer of dielectric to said first layer of dielectric;

forming at least one via in the substrate and introducing a conductive material to the at least one via;

attaching at least one electrical contact to the substrate;

attaching a first surface of the substrate to the encapsulant so that the substrate is connected to the IC;

attaching art electrical element having a plurality of electrical contacts to a second surface of the substrate;

electronically coupling the first surface of the substrate and the second surface of the substrate, wherein said encapsulant and said IC provide mechanical support for said first dielectric layer and said second dielectric layer while said substrate is fabricated and attached to the IC, and said IC and said electrical element are directly coupled electronically through said at least one via.

2. The method of claim 1, further comprising attaching the electrical element with a flip-chip C4 (controlled collapsed chip connection) process.

3. The method of claim 1, further comprising attaching a pin to the at least one electrical contact.

4. The method of claim 1, further comprising attaching a solder ball to the at least one electrical contact.

5. The method of claim 1, further comprising forming at least one routing trace on the at least one layer of dielectric.

6. The method of claim 1, further comprising:

applying conductive epoxy to the at least one via.

7. The method of claim 1, wherein forming at least one via comprises mechanical drilling.

8. The method of claim 1, wherein forming at least one via comprises laser drilling.

9. The method of claim 1, wherein forming at least one via comprises etching.

10. The method of claim 1, wherein the total thickness of said substrate is no more than approximately 100 microns.

11. The method of claim 1, wherein said first layer of dielectric and said second layer of dielectric are each no greater than approximately 35 microns thick.

12. The method of claim 1, wherein the electrical element is selected from the group consisting of a capacitor, a microprocessor, a memory and a converter.

13. The method of claim 1, wherein the electrical element is a decoupling capacitor.

* * * * *

UNITED STATES PATENT AND TRADEMARK OFFICE
CERTIFICATE OF CORRECTION

PATENT NO.    : 6,743,664 B2
DATED         : June 1, 2004
INVENTOR(S)   : Liang et al.

It is certified that error appears in the above-identified patent and that said Letters Patent is hereby corrected as shown below:

Column 4,
Line 43, delete "retrain" and insert -- remain --.
Line 45, before "first", insert -- a --.
Line 55, delete "art" and insert -- an --.

Signed and Sealed this

Thirty-first Day of August, 2004

JON W. DUDAS
*Director of the United States Patent and Trademark Office*